US006620640B2

(12) United States Patent
Gilton

(10) Patent No.: US 6,620,640 B2
(45) **Date of Patent: *Sep. 16, 2003**

(54) METHOD OF MAKING FIELD EMITTERS

(75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

This patent is subject to a terminal disclaimer.

(21) Appl. No.: 10/156,284

(22) Filed: May 28, 2002

(65) Prior Publication Data

US 2002/0137242 A1 Sep. 26, 2002

Related U.S. Application Data

(63) Continuation of application No. 09/782,396, filed on Feb. 13, 2001, now Pat. No. 6,426,234, which is a continuation of application No. 08/864,496, filed on May 28, 1997, now Pat. No. 6,187,604.

(51) Int. Cl.[7] .............................................. H01L 21/306
(52) U.S. Cl. ......................................................... 438/20
(58) Field of Search .............................. 438/20; 216/11; 445/50, 51

(56) References Cited

U.S. PATENT DOCUMENTS

| | | | |
|---|---|---|---|
| 3,665,241 | A | 5/1972 | Spindt et al. |
| 3,755,704 | A | 8/1973 | Spindt et al. |
| 3,812,559 | A | 5/1974 | Spindt et al. |
| 4,923,421 | A | 5/1990 | Brodie et al. |
| 5,232,549 | A | 8/1993 | Cathey et al. |
| 5,269,877 | A | 12/1993 | Bol |
| 5,329,207 | A | 7/1994 | Cathey et al. |
| 5,393,647 | A | 2/1995 | Neukermans et al. |
| 5,430,300 | A | 7/1995 | Yue et al. |
| 5,529,524 | A | 6/1996 | Jones |
| 5,652,474 | A | 7/1997 | Wilshaw et al. |
| 5,844,251 | A | 12/1998 | MacDonald et al. |
| 5,923,948 | A | 7/1999 | Cathey, Jr. |
| 5,981,303 | A | 11/1999 | Gilton |
| 6,080,032 | A | 6/2000 | Alwan |
| 6,187,604 | B1 | 2/2001 | Gilton |

OTHER PUBLICATIONS

Sze, S.M., *VLSI Technology,* 2nd Ed., pp. 115–116.

Xie, Y.H., et al., "Luminescence and Structural Study of Porous Silicon Films," American Institute of Physics, Mar. 1992, pp. 2403–2407.

(List continued on next page.)

*Primary Examiner*—Evan Pert
(74) *Attorney, Agent, or Firm*—TraskBritt

(57) ABSTRACT

A process is provided for forming sharp asperities useful as field emitters. The process comprises patterning and doping a silicon substrate. The doped silicon substrate is anodized. The anodized area is then used for field emission tips. The process of the present invention is also useful for low temperature sharpening of tips fabricated by other methods. The tips are anodized, and then exposed to radiant energy and the resulting oxide is removed.

22 Claims, 5 Drawing Sheets

OTHER PUBLICATIONS

Bsiesy, A., et al., "Anodic Oxidation of Porous Silicon Layers Formed on Lightly p–Doped Substrates," J. Electrochem. Soc., vol. 138, No. 11, Nov. 1991, pp. 3450–3456.

George, T., et al., "Microstructural Investigations of Ligh–Emitting Porous Si Layers," American Institute of Physics, May 1992, pp. 2359–2361.

Solomons, T.W. Graham, "Organic Chemistry," 2nd Ed., John Wiley & Sons, New York, 1976, pp. 63–64.

Wolf, Stanley, et al., "Silicon Processing for the VLSI Era," vol. 1, pp. 407–409, 1986.

Neamen, Donald A., "Semiconductor Physics and Devices," Solar Cells, pp. 615–625.

Seidel, H., et al., "Anistropic Etching of Crystalline Silicon in Alkaline Solutions," J. Electrochem. Soc., vol. 137, No. 11, Nov. 1990, pp. 3612–3626.

Beale, M.I.J., et al., "Microstructure and Formation Mechanism of Porous Silicon," American Institute of Physics, Jan. 1985, pp. 86–88.

Izidinov, S.O., et al., "Anomalously High Photovoltaic Activity of Polished n–Type Silicon During Anodic Porous–Layer Formation in Hydrofluoric–Acid Solutions," Elektrokhimiya, vol. 23, No. 11, pp. 1554–1559, Nov. 1987 (translated).

Motohiro, Tomoyoshi, et al., "Excitation Spectra of the Visible Photoluminescence of Anodized Porous Silicon," J. Appl. Phys., 1992.

Smith, R.L., et al., "Porous Si Formation Mechanisms," American Institute of Physics, Apr. 1992, pp. R1–R22.

Koyama, Hideki, et al., "Photoelectrochemical Effects of Surface Modification of n–Type Si with Porous Layer," J. Electrochem. Soc., vol. 138, No. 1, Jan. 1991, pp. 254–260.

Imai, Kazuo, et al., FIPOS (Full Isolation by Porous Oxidized Silicon) Technology and Its Application to LSI's IEEE Transactions on Electron Devices, vol. ED–31, No. 3, Mar. 1984, pp. 297–302.

Seidel, H., et al., "Anisotropic Etching of Crystalline Silicon in Alkaline Solutions," J. Electrochem. Soc., vol. 137, No. 11, Nov. 1990, pp. 3626–3632.

Branston et al., "Field Emission from Metal–Coated Silicon Tips," Oct. 1991, IEEE Transactions on Electron Devices, vol. 38, No. 10, pp. 2329–2313.

Arita, Yoshinobu, et al., "Formation and Properties of Porous Silicon Film," J. Electrochem. Soc., vol. 124, No. 2, pp. 285–295.

Anderson, Rolfe C., et al., "Investigations of the Electrical Properties of Porous Silicon," J. Electrochem. Soc., Nov. 1991, pp. 3406–3411.

Koshida, Nobuyoshi, et al., "Characterization Studies of p–Type Porous Si and Its Photoelectrochemical Activation," J. Electrochem. Soc., Mar. 1991, pp. 837–841.

Turner, Dennis R., "Electropolishing Silicon in Hydrofluoric Acid Solutions," J. Electrochem. Soc., Jul. 1958, pp. 402–408.

METHOD OF MAKING FIELD EMITTERS

CROSS-REFERENCE TO RELATED APPLICATIONS

This application is a continuation of application Ser. No. 09/782,396, filed Feb. 13, 2001, now U.S. Pat. No. 6,426,234, which is a continuation of application Ser. No. 08/864,496, filed May 28, 1997, now U.S. Pat. No. 6,187,604 B1, issued Feb. 13, 2001.

BACKGROUND OF THE INVENTION

1. Field of the Invention

This invention relates to field emission devices and, more particularly, to a method of fabricating field emitters useful in displays.

2. State of the Art

Cathode ray tube (CRT) displays, such as those commonly used in desk-top computer screens, function as a result of a scanning electron beam from an electron gun impinging on phosphors on a relatively distant screen. The electrons increase the energy level of the phosphors. When the phosphors return to their normal energy level, they release the energy from the electrons as a photon of light, which is transmitted through the glass screen of the display to the viewer. One disadvantage of a CRT is the depth of the display required to accommodate the raster scanner.

Flat panel displays have become increasingly important in appliances requiring lightweight portable screens. Currently, such screens use electroluminescent or liquid crystal technology. Another promising technology is the use of a matrix-addressable array of cold cathode emission devices to excite phosphor on a screen, often referred to as a field emitter display.

Spindt et al. discusses field emission cathode structures in U.S. Pat. Nos. 3,665,241, 3,755,704, and 3,812,559. To produce the desired field emission, a potential source is provided with its positive terminal connected to the gate or grid and its negative terminal connected to the emitter electrode (cathode conductor substrate). The potential source is variable for the purpose of controlling the electron emission current.

Upon application of a potential between the electrodes, an electric field is established between the emitter tips and the low potential anode grid, thus causing electrons to be emitted from the cathode tips through the holes in the grid electrode.

BRIEF SUMMARY OF THE INVENTION

The clarity or resolution of a field emission display is a function of a number of factors, including emitter tip sharpness. The process of the present invention is directed toward the fabrication of very sharp cathode emitter tips.

One aspect of the process of the present invention involves forming sharp asperities useful as field emitters. The process comprises patterning and doping a silicon substrate. The doped silicon substrate is anodized. Where the silicon substrate was doped, regions of very sharply defined spires of porous silicon are formed. These sharp spires or asperities are useful as emitter tips.

Another aspect is fabrication of emitter tips using porous silicon. The method comprises blanket doping and anodizing a silicon substrate. The unmasked, anodized substrate is then exposed to patterned ultraviolet light. The exposed areas are oxidized in air. The oxidized areas are either stripped with hydrofluoric acid or retained as an isolation mechanism.

A further aspect of the present invention is the sharpening of field emitters. The method comprises anodizing existing silicon emitters, thereby causing the emitters to become porous. The porous silicon tips are exposed to ultraviolet light and rinsed with a hydrogen halide. The ultraviolet light oxidizes the tips and they become sharper as the oxide is stripped.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
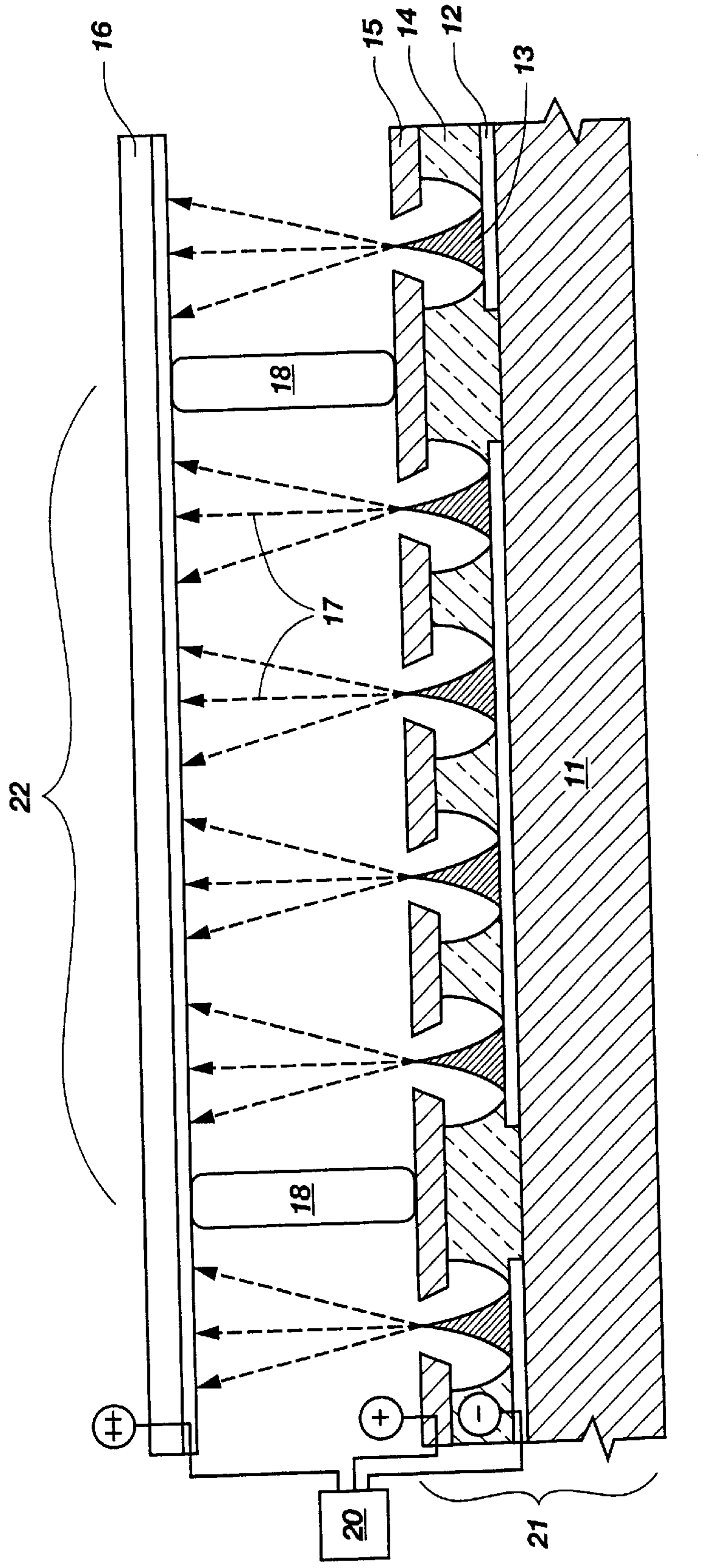
FIG. 1 is a schematic cross-section of a field emission display having emitter tips.

Referring to FIG. 1, a representative field emission display employing a display segment 22 is depicted. Each display segment 22 is capable of displaying a pixel of information, or a portion of a pixel, as, for example, one green dot of a red/green/blue full-color triad pixel.

Preferably, a single crystal silicon layer serves as a substrate 11. Alternatively, amorphous silicon deposited on an underlying substrate comprised largely of glass or other combination may be used as long as a material capable of conducting electrical current is present on the surface of a substrate so that it can be patterned and etched to form micro-cathodes 13.

At a field emission site, a micro-cathode 13 has been constructed on top of the substrate 11. The micro-cathode 13 is a protuberance which may have a variety of shapes, such as pyramidal, conical, or other geometry, which has a fine micropoint for the emission of electrons. Surrounding the micro-cathode 13 is a grid or gate structure 15. When a voltage differential, through source 20, is applied between the micro-cathode 13 and the gate structure 15, a stream of electrons 17 is emitted toward a phosphor coated screen or faceplate 16. This screen or faceplate 16 is an anode.

The electron emission tip of micro-cathode 13 is integral with substrate 11 and serves as a cathode. Gate structure 15 serves as a grid structure for applying an electrical field potential to its respective micro-cathode 13.

A dielectric insulating layer 14 is deposited on the conductive micro-cathode 13, which micro-cathode 13 can be formed from the substrate or from one or more deposited conductive films 12, such as a chromium amorphous silicon bilayer. The dielectric insulating layer 14 also has an opening at the field emission site location.

Disposed between the faceplate 16 and baseplate 21 are located spacer support structures 18 which function to support the atmospheric pressure which exists on the faceplate 16 as a result of the vacuum which is created between the baseplate 21 and faceplate 16 for the proper functioning of the emitter tips of micro-cathode 13.

The baseplate 21 of the invention comprises a matrix addressable array of micro-cathodes 13, the substrate 11 on which the micro-cathodes 13 are created, the dielectric insulating layer 14, and the grid structure 15.

The process of the present invention provides a method for fabricating very sharp emitter tips of micro-cathode 13 useful in displays of the type illustrated in FIG. 1.

Figure 2:
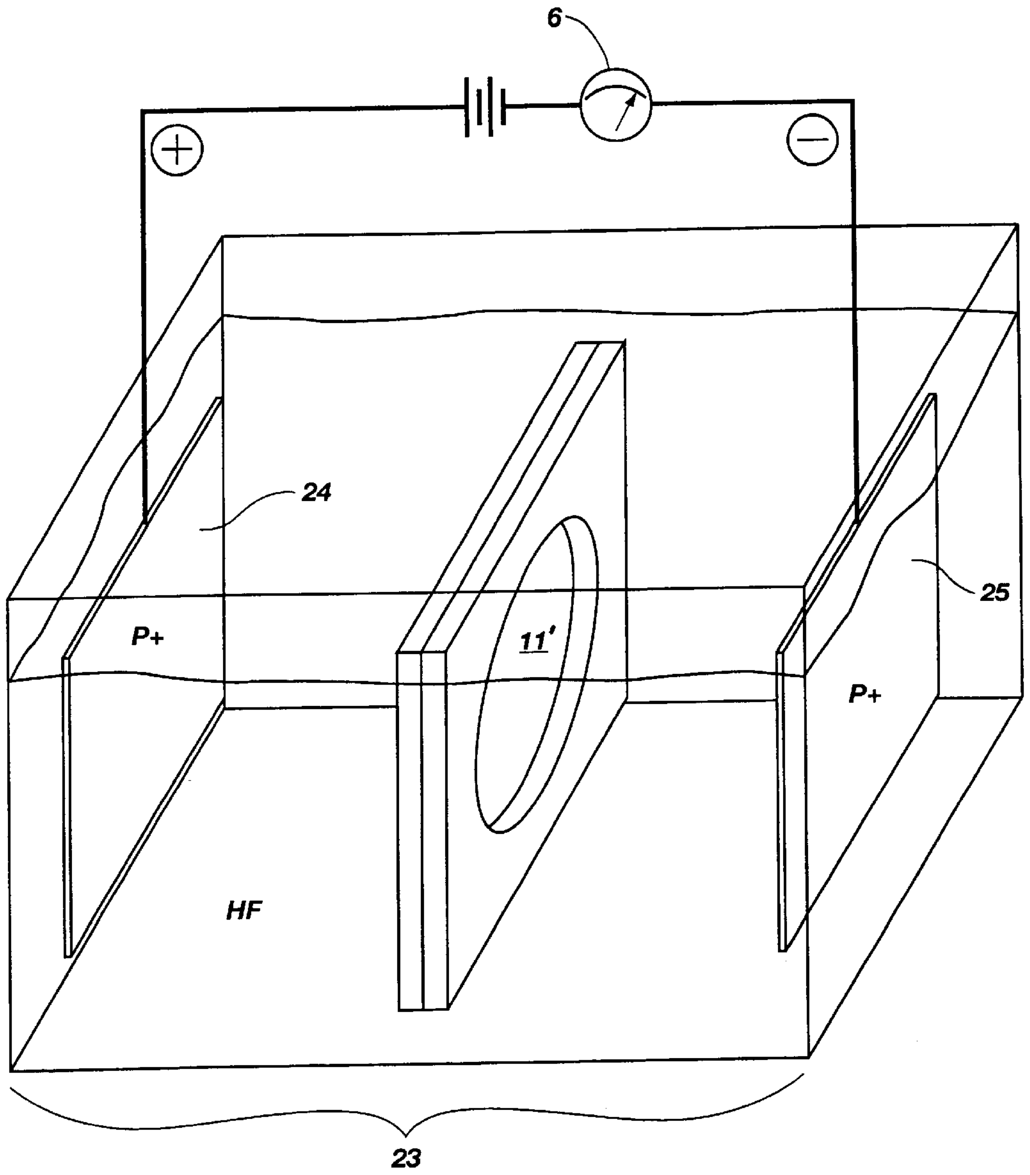
FIG. 2 is a schematic cross-section of an anodization chamber.

FIG. 2 is a schematic cross-section of a representative anodization chamber 23 of the type used in the process of the present invention. A wafer 11' is suspended between two liquid baths and seals one bath from the other.

In the first bath is disposed a metallic electrode 24, which, in this example, is platinum. The electrode 24 is a cathode and, therefore, has a positive charge when a voltage 26 (not shown) is placed between the baths. An electrode 25 is placed in the second bath. The electrode 25 is also platinum, in this example, and functions as an anode, as electrode 25 has a negative potential when a voltage 26 is placed between the baths.

In addition to water, the second bath also contains a hydrogen halide and a surfactant. The volume ratio of water to hydrogen halide to surfactant is 1:1:1. The preferred surfactant is an alcohol, such as isopropyl alcohol, which is relatively inexpensive and pure and commercially available. However, ethanol, 2-butanol, and Triton X100 are also suitable surfactants. The preferred hydrogen halide is hydrofluoric acid (HF).

When a voltage 26 is applied between the electrodes 24, 25, the chemicals in the second bath are attracted to the wafer 11' and react with it.

Electrochemical anodization of silicon in hydrofluoric acid etches a network of tiny pores into the silicon surface and forms a layer of porous material. Porous silicon forms at current densities from 10 to 250 $mA/cm_2$ in hydrofluoric acid concentrations from 1–49 weight percent, with resulting porosities from 27% to 70%.

Figure 3A:
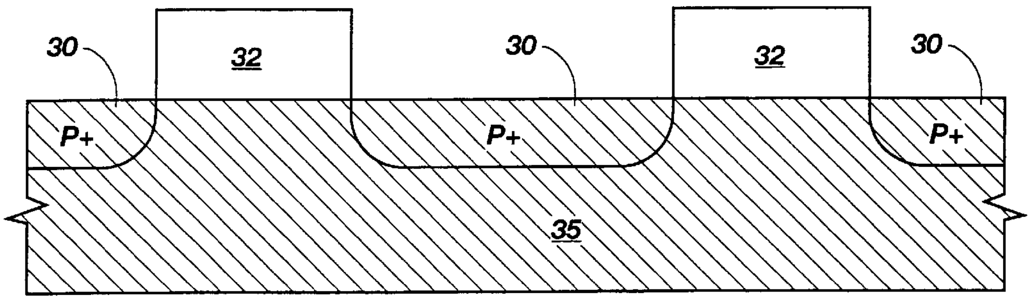
FIGS. 3A–3B are schematic cross-sections of one embodiment of the process of the present invention.
Figure 3B:
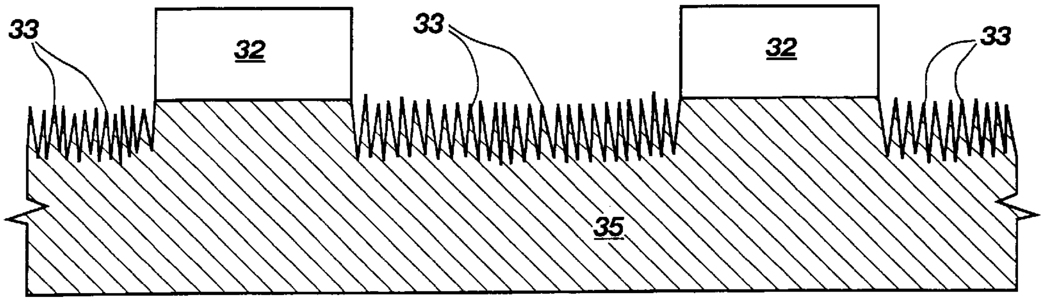

FIGS. 3A–3B illustrate the one embodiment of the process of the present invention. FIG. 3A illustrates a substrate 35 which has been patterned and subsequently doped. The substrate 35 comprises silicon and can be amorphous silicon, polycrystalline silicon, microgram silicon, and macrograin silicon, or any other suitable silicon-containing substrate.

The substrate 35 is patterned with a mask 32. Mask 32 preferably comprises a photoresist or an oxide. The masked substrate 35 is then doped. The preferable dopant is boron, and therefore the doped regions 30 are P+.

The substrate 35 is then disposed in an anodization chamber 23 of the type described in FIG. 2. The substrate 35 is anodized in the unmasked areas or doped regions 30. The doped regions 30 become porous as a result of the chemicals reacting with the dopant in the substrate 35. As the anodization process continues, the porous silicon develops a structure having randomly distributed, sharp spires or tips 33, as illustrated in FIG. 3B.

These tips 33 are useful as emitters in flat panel displays of the field emission type. The mask 32 is then stripped and the display fabricated. Alternatively, the mask 32 is left on the substrate 35 and functions as dielectric insulating layer 14.

Figure 4A:
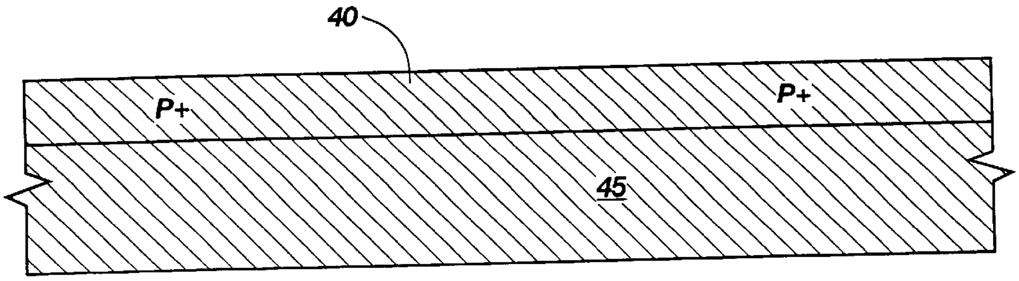
FIGS. 4A–4C are schematic cross-sections of another embodiment of the process of the present invention.
Figure 4B:
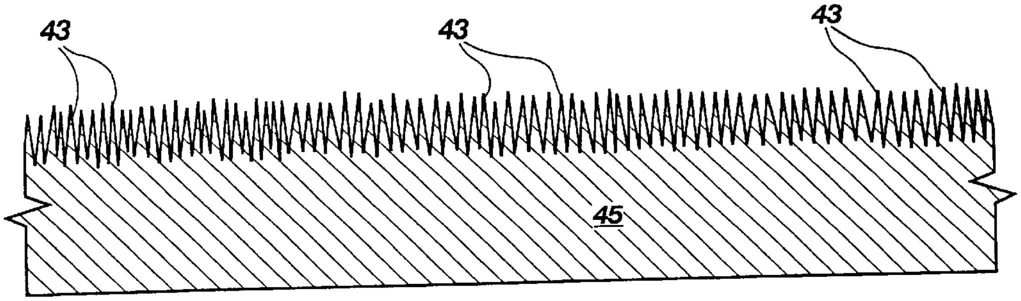
Figure 4C:
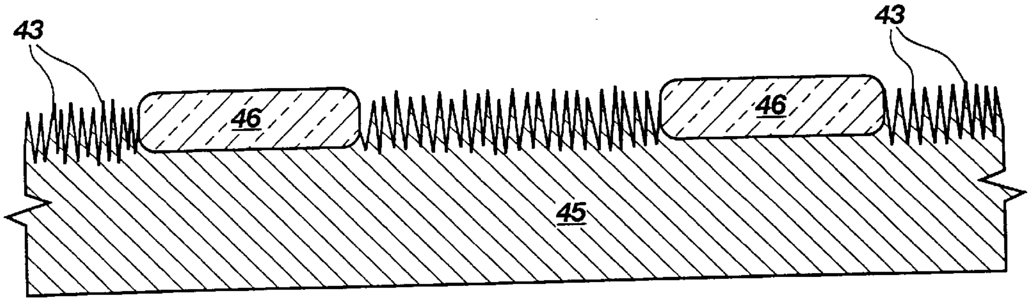

FIGS. 4A–4C illustrate another embodiment of the process of the present invention. FIG. 4A illustrates substrate 45 which has a "blanket" dopant layer 40. "Blanket" doping referring to the doping of substantially the entire surface of the substrate 45. As in the previous embodiment, the substrate 45 comprises silicon and can be amorphous silicon, polycrystalline silicon, micrograin silicon, and macrograin silicon, or any other suitable silicon-containing substrate. The preferred dopant in this embodiment is also boron, and therefore the doped layer is P+.

FIG. 4B illustrates the substrate 45 after it has undergone an anodization step, in which the dopant layer 40 becomes porous. The anodization take places in an anodization chamber 23 of the type illustrated in FIG. 2. Since substantially the whole surface of the substrate 45 is doped and unmasked, substantially the whole dopant layer 40 is anodized.

As shown in FIG. 4C, subsequent to the anodization step, substrate 45 is patterned with a mask 46. The mask 46 preferably comprises a photoresist or an oxide. The substrate 45 is then exposed to electromagnetic radiation (e.g., ultraviolet light) at or about room temperature for approximately 5 to 10 minutes. These parameters will vary with the intensity of the light selected.

Alternatively, the substrate 45 is simply exposed to patterned electromagnetic radiation, e.g., light that is shined through a photolithographic mask. This process is analogous to the process for exposing photoresist with a stepper. The preferred wavelength of light is in the ultraviolet spectrum.

The areas exposed to light are oxidized in air (actually, by the oxygen in the atmosphere). The oxidized areas can be used for isolation, or the oxide can be removed by rinsing in a hydrogen halide, such as hydrofluoric acid. The tips 43 are useful as field emitters of the type discussed in FIG. 1.

Figure 5A:
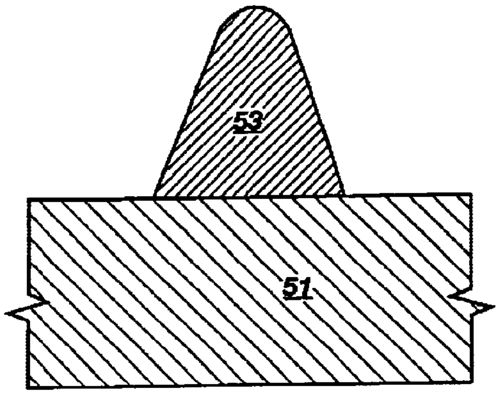
Fig. 5A (PRIOR ART)
FIGS. 5A–5D are schematic cross-sections of a further embodiment of the process of the present invention.

FIGS. 5A–5D illustrate low temperature oxidation sharpening of emitter tips using the process of the present invention. FIG. 5A illustrates a tip 53 on a substrate 51 made by any of the methods know in the art, and most commonly comprises silicon. The radius of curvature of the apex of the tip 53 is somewhat rounded.

Figure 5B:
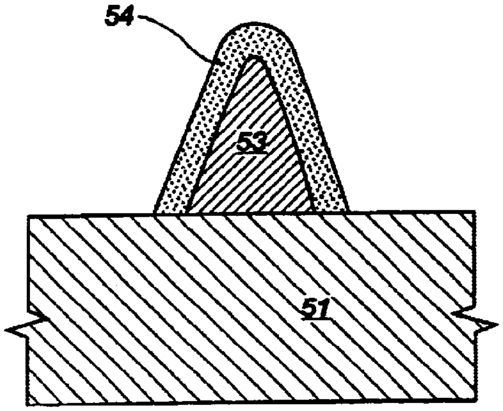

FIG. 5B shows the tip 53 on the substrate 51 after the tip 53 has been anodized, according to the process of the present invention. The tip 53 is placed in an anodization chamber of the type shown in FIG. 2. A porous layer 54 forms on the tip 53 as a result of the anodization, as shown in FIG. 5B.

Figure 5C:
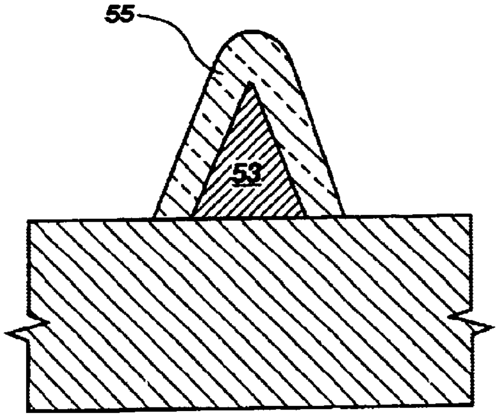

The tip 53 is then exposed to radiant energy, preferably light, in the ultraviolet spectrum. The tip 53 is exposed to the ultraviolet light at room temperature (e.g., approximately 22° C.–100° C.) in air. The oxygen in the atmosphere oxidizes the porous layer 54 on the tip 53, when the tip 53 is irradiated, thereby forming oxide layer 55, as illustrated in FIG. 5C.

Figure 5D:
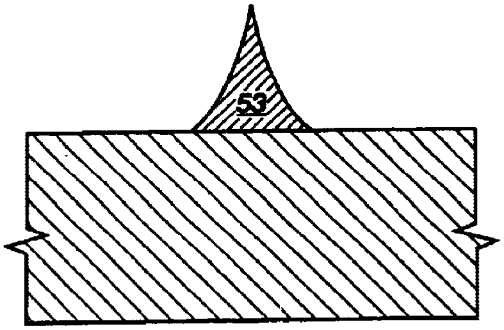

The oxide layer 55 is then stripped, preferably in a hydrogen halide. Hydrofluoric acid (HF) is the preferred hydrogen halide. When the oxide layer 55 is removed, the tip 53 on the substrate 51 is noticeably sharper, as shown in FIG. 5D.

There are several advantages to the process of the present invention. One of the most important is that the process takes place at or about room temperature. The anodization process of the present invention results in a very high surface area that is easily oxidized. Most oxidation processes of semiconductor substrates are done in a steam ambient requiring high temperatures. The porous silicon is oxidized by ultraviolet light at low temperatures, i.e., 20° C.100° C.

All of the U.S. Patents cited herein are hereby incorporated by reference herein as if set forth in their entirety.

While the particular process, as herein shown and disclosed in detail, is fully capable of obtaining the objects and advantages herein before stated, it is to be understood that it is merely illustrative of the presently preferred embodiments of the invention, and that no limitations are intended to the details of construction or design herein shown other than as described in the appended claims. For example, one having ordinary skill in the art will realize that the parameters can vary.

What is claimed is:

1. A method for fabricating field emitters, the method comprising:

forming a pattern on a substrate comprising silicon to define isolated exposed regions;

doping said isolated exposed regions of said substrate; and anodizing said isolated exposed regions of said substrate to form regions of field emitter tips, wherein said regions of field emitter tips are isolated by adjacent regions with relatively undoped silicon.

2. The method of claim 1, wherein forming comprises forming said pattern on at least one of a polycrystalline silicon substrate, an amorphous silicon substrate, a microgram silicon substrate and a macrograin silicon substrate.

3. The method of claim 1, wherein anodizing comprises anodizing with at least one of hydrogen halide, water, and a surfactant.

4. The method of claim 3, wherein anodizing comprises anodizing with said surfactant comprising at least one of ethanol, isopropyl alcohol, 2-butanol, and Triton X100.

5. The method of claim 3, wherein anodizing comprises anodizing with said hydrogen halide comprising hydrofluoric acid (HF), said hydrofluoric acid being 49 weight percent prior to anodization.

6. The method of claim 5, wherein anodizing comprises anodizing in an electrochemical bath with a current of less than 250 $mA/cm_2$ being applied to said electrochemical bath.

7. A process for forming sharp asperities useful as field emitters, the process comprising:

patterning a silicon substrate to form patterned and exposed areas on said silicon substrate; and selectively anodizing said exposed areas of said silicon substrate to form a plurality of said sharp asperities in each of said exposed areas.

8. The process of claim 7, further comprising doping said exposed areas on said substrate with boron.

9. The process of claim 7, wherein selectively anodizing comprises anodizing with an aqueous solution of at least one of a hydrogen halide and a surfactant.

10. The process of claim 9, wherein anodizing comprises anodizing with at least one of ethanol, isopropyl alcohol, 2-butanol, and Triton X100.

11. The process of claim 9, wherein anodizing comprises anodizing with said hydrogen halide comprised of hydrofluoric acid.

12. The process of claim 7, wherein patterning comprises patterning with at least one of a photoresist and an oxide mask.

13. The process of claim 7, wherein selectively anodizing comprises anodizing said silicon substrate in a solution comprising water, hydrofluoric acid, and isopropyl alcohol in a volume ratio of 1:1:1.

14. The process of claim 7, wherein patterning comprises patterning a silicon substrate comprising at least one of a polycrystalline silicon substrate, an amorphous silicon substrate, a microgram silicon substrate and a macrograin silicon substrate.

15. A method of fabricating isolated arrays of emitter tips, the method comprising:

forming patterned regions and unpatterned regions on a silicon substrate;

doping said unpatterned regions of said silicon substrate; and anodizing said unpatterned regions on said silicon substrate to form the arrays of emitter tips in said unpatterned regions on said silicon substrate, the arrays of emitter tips separated by said patterned regions of said silicon substrate.

16. The method of claim 15, wherein forming comprises patterning said silicon substrate with an oxide.

17. The method of claim 16, further comprising disposing said array of emitter tips in a field emission display having an anode grid, wherein said oxide functions as an insulator to electrically isolate said array of emitter tips from said anode grid.

18. The method of claim 15, wherein doping comprises doping said silicon substrate with boron.

19. The method of claim 17, wherein anodizing comprises anodizing with an aqueous solution of at least one of a hydrogen halide and a surfactant.

20. The method of claim 15, wherein forming comprises patterning said silicon substrate with a photoresist.

21. The method of claim 20, further comprising removing said photoresist from said silicon substrate.

22. The method of claim 15, wherein forming comprises patterning a silicon substrate comprising at least one of a polycrystalline silicon substrate, an amorphous silicon substrate, a microgram silicon substrate and a macrograin silicon substrate.

* * * * *

UNITED STATES PATENT AND TRADEMARK OFFICE
CERTIFICATE OF CORRECTION

PATENT NO. : 6,620,640 B2
DATED : September 16, 2003
INVENTOR(S) : Terry L. Gilton It is certified that error appears in the above-identified patent and that said Letters Patent is hereby corrected as shown below:

Title page,
Item [54], Title, after "EMITTERS" insert -- USING POROUS SILICON --

Column 1,
Line 8, change "234," to -- 234 B2, issued July 30, 2002, --

Column 3,
Line 17, change "26 (not" to -- 6 --
Line 18, delete "shown)"
Lines 21 and 31, change "26" to -- 6 --
Line 37, change "$mA/cm_2$" to -- $mA/cm^2$ --
Line 40, before "one" delete "the"

Column 4,
Line 2, change "referring" to -- refers --
Line 36, change "know" to -- known --

Column 5,
Lines 23-24, change "microgram" to -- micrograin --
Line 37, change "$mA/cm_2$" to -- $mA/cm^2$ --

Column 6,
Lines 17 and 49, change "microgram" to -- micrograin --

Signed and Sealed this

Twenty-eighth Day of September, 2004

JON W. DUDAS
*Director of the United States Patent and Trademark Office*